United States Patent
Ando et al.

(10) Patent No.: US 7,245,128 B2
(45) Date of Patent: Jul. 17, 2007

(54) MAGNETIC RESONANCE IMAGING APPARATUS AND MAGNET APPARATUS THEREFOR

(75) Inventors: Ryuya Ando, Hitachi (JP); Mitsushi Abe, Hitachinaka (JP); Hiroyuki Watanabe, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/169,940

(22) Filed: Jun. 30, 2005

(65) Prior Publication Data

US 2006/0001427 A1 Jan. 5, 2006

(30) Foreign Application Priority Data

Jul. 2, 2004 (JP) ............................. 2004-196196
May 25, 2005 (JP) ............................. 2005-152198

(51) Int. Cl.
*G01V 3/00* (2006.01)
(52) U.S. Cl. ...................... 324/319; 324/320; 335/299 I
(58) Field of Classification Search ................ 324/319, 324/320; 335/299, 301
See application file for complete search history.

(56) References Cited

U.S. PATENT DOCUMENTS

| | | | | |
|---|---|---|---|---|
| 5,446,434 A | * | 8/1995 | Dorri et al. ................. | 335/301 |
| 6,255,928 B1 | * | 7/2001 | van Oort et al. ............ | 335/301 |
| 6,275,128 B1 | * | 8/2001 | Aoki et al. ................. | 335/299 |
| 6,566,991 B1 | | 5/2003 | Rimkunas et al. | |
| 6,778,054 B1 | * | 8/2004 | Huang et al. ............... | 335/301 |

FOREIGN PATENT DOCUMENTS

| | | |
|---|---|---|
| EP | 0619499 | 10/1994 |
| EP | 0629872 | 12/1994 |
| EP | 0760484 | 3/1997 |
| EP | 0996000 | 4/2000 |
| EP | 0999456 | 5/2000 |
| JP | 05-243037 | 9/1992 |
| JP | 11-261379 | 9/1999 |
| JP | 2001-078984 | 3/2001 |
| JP | 2001-224570 | 8/2001 |
| JP | 2002-165773 | 6/2002 |
| JP | 2002-238874 | 8/2002 |
| JP | 2002-253530 | 9/2002 |
| JP | 2003-024299 | 1/2003 |
| JP | 2003-153879 | 5/2003 |
| WO | WO 01/31359 | 5/2001 |

OTHER PUBLICATIONS

European Search Report dated Oct. 27, 2005.

\* cited by examiner

*Primary Examiner*—Louis M. Arana
(74) *Attorney, Agent, or Firm*—Crowell & Moring LLP

(57) ABSTRACT

A magnetic resonance imaging apparatus and the magnet apparatus thereof comprise plural pairs of magnetic field generation sources, arranged face to face with each other, for forming a magnetic field space 3; and magnetic field homogeneity adjusting apparatuses 17 and 18 for providing homogeneity adjustment of the magnetic field formed in the magnetic field space 3. The magnetic field homogeneity adjusting apparatuses 17 and 18 contain a plurality of tapped holes 24 for installing a magnetic field homogeneity adjusting member 26 of smaller volume in a plate-formed tray made of a non-magnetic substance; and a plurality of mounts 25 for installing the magnetic field homogeneity adjusting member 27 of greater volume, these mounts being formed over the area containing a plurality of through-holes for permitting installation of a magnetic field homogeneity adjusting member 26 of smaller volume, whereby major magnetic field adjusting work can be performed independently of minor magnetic field adjusting work.

14 Claims, 9 Drawing Sheets

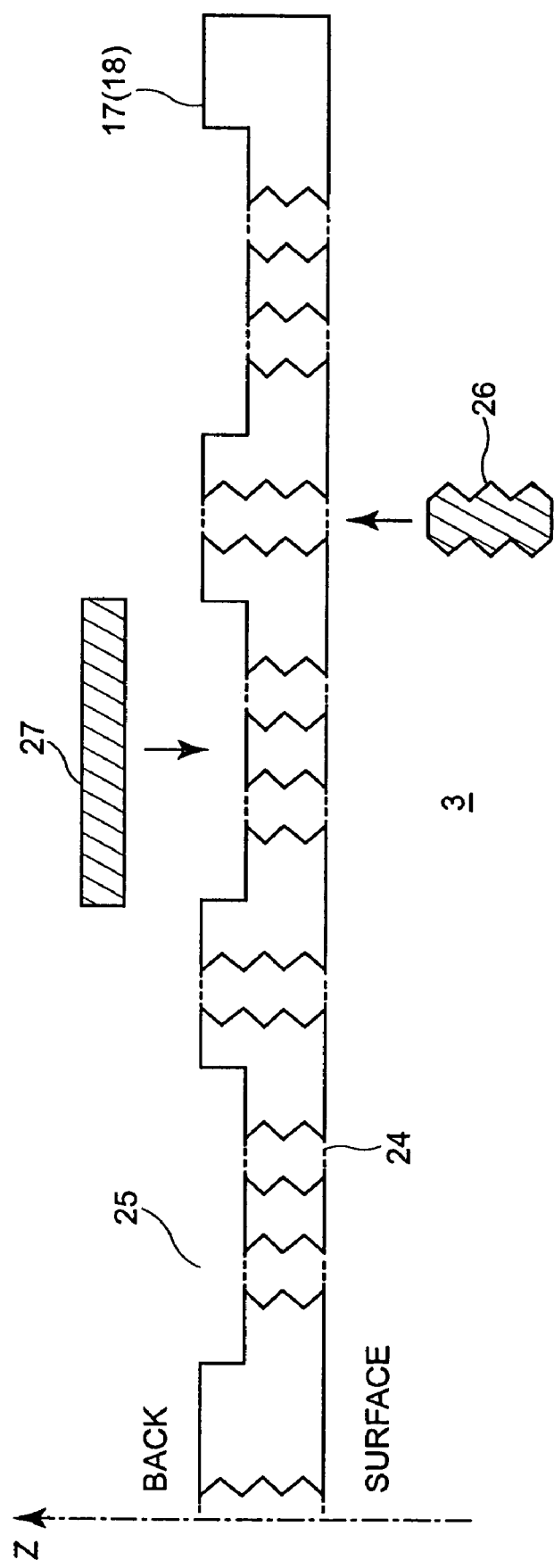

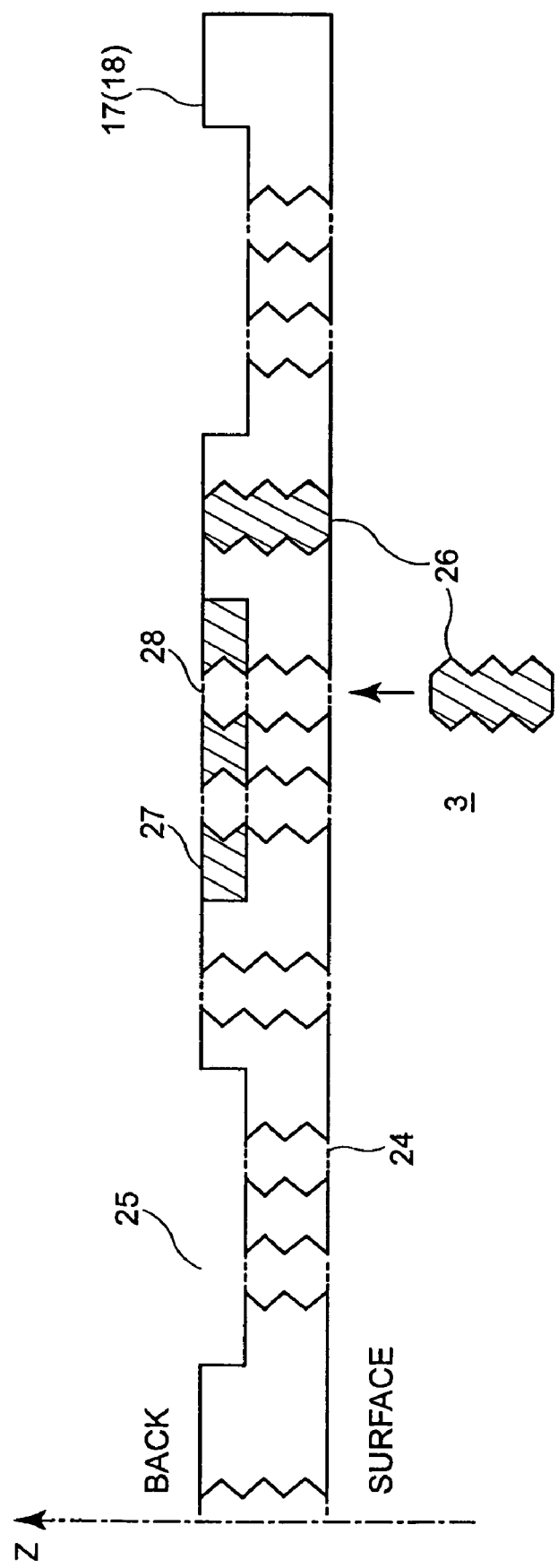

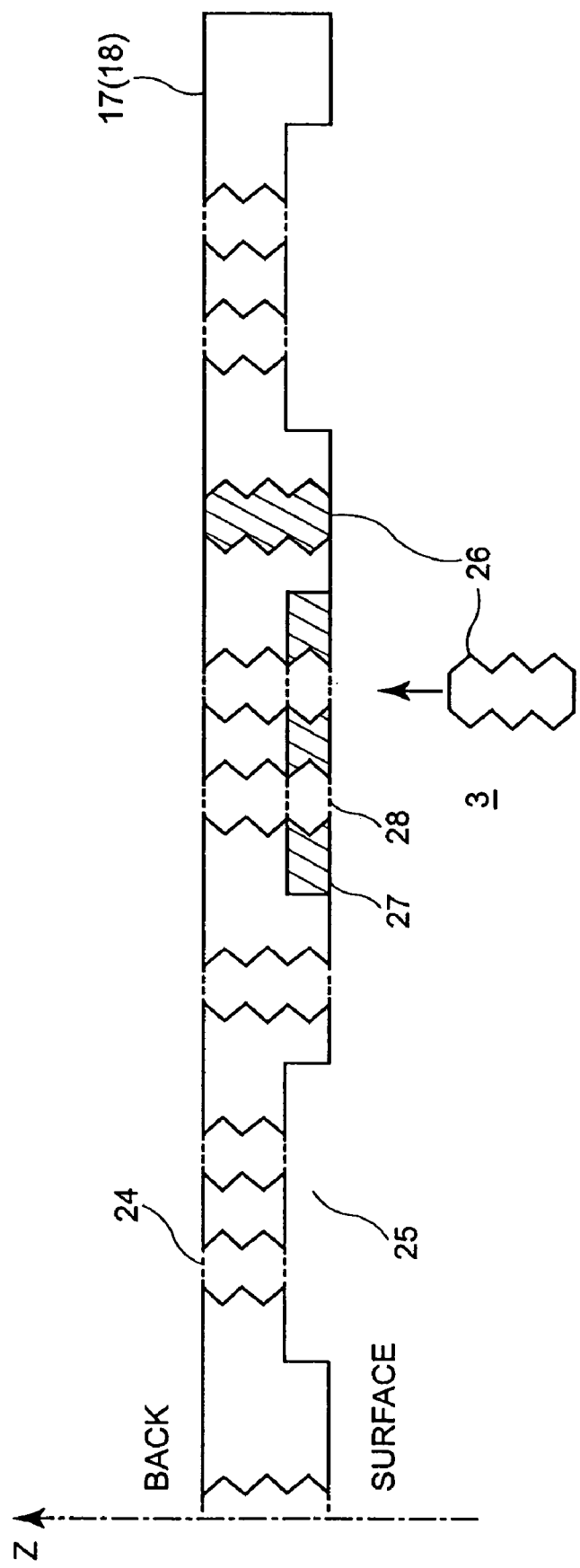

MAGNETIC RESONANCE IMAGING APPARATUS AND MAGNET APPARATUS THEREFOR

BACKGROUND OF THE INVENTION

The present invention relates to a magnetic resonance imaging apparatus equipped with a magnet apparatus, preferably used to form a homogeneity magnetic field in a space, wherein magnetic field generation sources are arranged face to face with each other; and a magnet apparatus used as a magnetic field generation source therefor.

A magnetic resonance imaging apparatus provides an image representing the physical and chemical properties of a test object (sample), using the nuclear magnetic resonance that occurs when a high frequency pulse is applied to the test object placed in a homogeneity static magnetic field space. It is mainly used for medical services. The magnetic resonance imaging apparatus (also called the MRI) commonly comprises a magnetic field generation source for applying a homogeneity static magnetic field in the imaging area where the test object is brought, an RF coil for applying a high frequency pulse to the imaging area, a receiving coil for receiving a response from the imaging area, and a gradient coil for applying a gradient magnetic field in the imaging area.

One of the requirements to improve the image quality of a magnetic resonance imaging apparatus is to improve the homogeneity of static magnetic field. To make homogeneity the static magnetic field applied to the imaging area from the magnetic field generation source, the magnetic apparatus used in the magnetic resonance imaging apparatus has the magnetic field adjusted in each phase of designing, assembling and installation.

In the adjustment of the magnetic field in the phase of designing, the magnetic field is made homogeneity, for example, by changing the magnetic properties of the magnetic pole material, depending on the place where the magnetic pole of the magnetic field generation source is machined. The Japanese Application Patent Laid-open Publication No. 2002-253530 discloses the method of generating a homogeneity magnetic field by a magnetic pole provided with a concentric annular cavity. The Japanese Application Patent Laid-open Publication No. Hei 05-243037 discloses the method of changing the thickness of the magnetic pole that changes the saturated magnetization characteristic of a magnetic substance, according to the center and periphery of the magnetic pole surface, whereby a homogeneity magnetic field is created. Japanese Application Patent Laid-open Publication No. 2003-24299 discloses the method of forming a groove and projection on the surface of the magnetic pole, thereby generating a homogeneity magnetic field.

The methods described in Japanese Application Patent Laid-open Publication No. 2002-253530, Japanese Application Patent Laid-open Publication No. Hei 05-243037 and Japanese Application Patent Laid-open Publication No. 2003-24299, however, are the methods for magnetic field adjustment in the so-called phase of designing. These methods fail to create the homogeneity magnetic field by correcting the components of poor homogeneity resulting the production error and ambient environment. This requires final adjustment of the magnetic field to be made in the phase of assembling and installation.

The magnetic field in the phase of assembling is adjusted by correcting the components of poor homogeneity resulting the production error and ambient environment for example, by additionally distributing the magnetic field homogeneity adjusting members composed of a magnetic substance and a permanent magnet, to the magnet apparatus or by removing the magnetic field homogeneity adjusting member. The magnetic field homogeneity adjusting member is commonly arranged in the space sandwiched between the opposing magnetic field generation sources and the gradient coil arranged inside (in the imaging area). Based on this arrangement, Japanese Application Patent Laid-open Publication No. 2001-78984 discloses the method of arranging the magnetic field adjusting members at an interval smaller than the magnetic field adjusting member, thereby ensuring high-precision adjustment of the magnetic field.

Magnetic field adjustment in the phase of installation is the same as that in the phase of assembling. A design is preferably worked out to ensure that each adjustment of magnetic field can be made by one and the same magnetic field adjusting mechanism. Another adjusting mechanism is provided in some cases for improvement of workability. Japanese Application Patent Laid-open Publication No. 2002-238874 discloses a method of using a superconducting coil as a magnetic field generation source. A magnetic field homogeneity adjusting mechanism is provided in the space adjacent to the coil container for storing this superconducting coil, thereby enhancing the efficiency of the magnetic field adjustment. Japanese Application Patent Laid-open Publication No. 2001-224570 introduces a method of forming a radiant groove on a piece of magnetic pole and inserting into this groove a non-magnetic rod with a magnetic field homogeneity adjusting member made of a magnetic substance arranged thereon, whereby the efficiency of magnetic field adjacent is improved. Japanese Application Patent Laid-open Publication No. 2003-153879 describes the method of forming a hole on the gradient coil, which is used as a magnetic field homogeneity adjusting mechanism.

Japanese Application Patent Laid-open Publication No. 2002-165773 describes an MRI apparatus wherein multiple shim holes of different sizes are formed on a shim plate, and a plurality of different shim materials are combined and inserted into the shim holes.

SUMMARY OF THE INVENTION

When the static magnetic field generated by the magnet apparatus exhibits a high degree of intensity, the impact of the surrounding environment upon magnetic field homogeneity is so high that it cannot be ignored. Adjustment of magnetic field in the phase of assembling and installation requires use of a great number of magnetic field homogeneity adjusting members in many cases. According to the prior art described in the Japanese Application Patent Laid-open Publication No. 2001-78984, the Japanese Application Patent Laid-open Publication No. 2002-238874, the Japanese Application Patent Laid-open Publication No. 2001-224570, and the Japanese Application Patent Laid-open Publication No. 2003-153879, magnetic field homogeneity in each of the phases of assembling and installation must be adjusted by using one and the same mechanism for major magnetic field adjustment work with a great number of magnetic field homogeneity adjusting members, and minor magnetic field adjustment work with a small number of magnetic field homogeneity adjusting members; or by using separate mechanisms installed in different spaces.

When one and the same mechanism is used or major magnetic field adjustment work and minor magnetic field adjustment work, it is necessary to prepare a great number of magnetic field homogeneity adjusting members, ranging from the magnetic field homogeneity adjusting members having a very small volume to those having a large volume. In the meantime, when separate mechanisms are installed in different spaces, the magnet apparatus is required to have a new space for the magnetic field homogeneity adjusting mechanism. This has raised the problem of an increased size of the apparatus, hence increased costs.

According to the prior art described in the Japanese Application Patent Laid-open Publication No. 2002-165773, it is necessary to prepare a great number of magnetic field homogeneity adjusting members, ranging from the magnetic field homogeneity adjusting members having a very small volume to those having a large volume.

The first object of the present invention is to provide a magnetic resonance imaging apparatus and the magnet apparatus thereof capable of covering a wide scope of magnetic field homogeneity adjusting work ranging from major adjusting work to minor adjusting work, using a smaller number of types of magnetic field homogeneity adjusting members in a limited space.

The second object of the present invention is to provide a magnetic resonance imaging apparatus and the magnet apparatus thereof capable of separately performing major magnetic field adjusting work and minor magnetic field adjusting work, using a pair of magnetic field homogeneity adjusting members arranged face to face with each other.

To achieve the aforementioned objects, a magnetic resonance imaging apparatus and the magnet apparatus thereof according to the present invention comprise plural pairs of magnetic field generation sources, arranged face to face with each other, for forming a magnetic space; and a magnetic field homogeneity adjusting apparatus for providing homogeneity adjustment of the magnetic field formed in the magnetic field. A plate-formed tray formed of a non-magnetic substance is provided with a plurality of through-holes for arranging a magnetic field homogeneity adjusting member of small volume; and a plurality of mounts for arranging a magnetic field homogeneity adjusting member of large volume, wherein these mounts are formed over the area containing several through-holes. Thus, the magnetic field homogeneity adjusting member is configured to separately perform major magnetic field adjusting work and minor magnetic field adjusting work.

The plate-formed tray is equipped with a plurality of tapped holes as through-holes, and a counterbore for installing the magnetic field homogeneity adjusting member of large volume.

The present invention allows major magnetic field adjusting work and minor magnetic field adjusting work to be performed separately, using a pair of magnetic field homogeneity adjusting members arranged face to face with each other. The present invention also makes it possible to handle a wide scope of magnetic field homogeneity adjusting work ranging from major adjusting work to minor adjusting work, using a few number of types of magnetic field homogeneity adjusting members in a limited space.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 5 is a vertical sectional view representing the magnetic field homogeneity adjusting apparatus shown in FIG. 4;

FIG. 8 is a vertical sectional view representing an example of a variation of the magnetic field homogeneity adjusting apparatus;

FIG. 9 is a vertical sectional view representing an example of another variation of the magnetic field homogeneity adjusting apparatus;

DETAILED DESCRIPTION OF THE PREFERRED EMBODIMENTS

Figure 1:
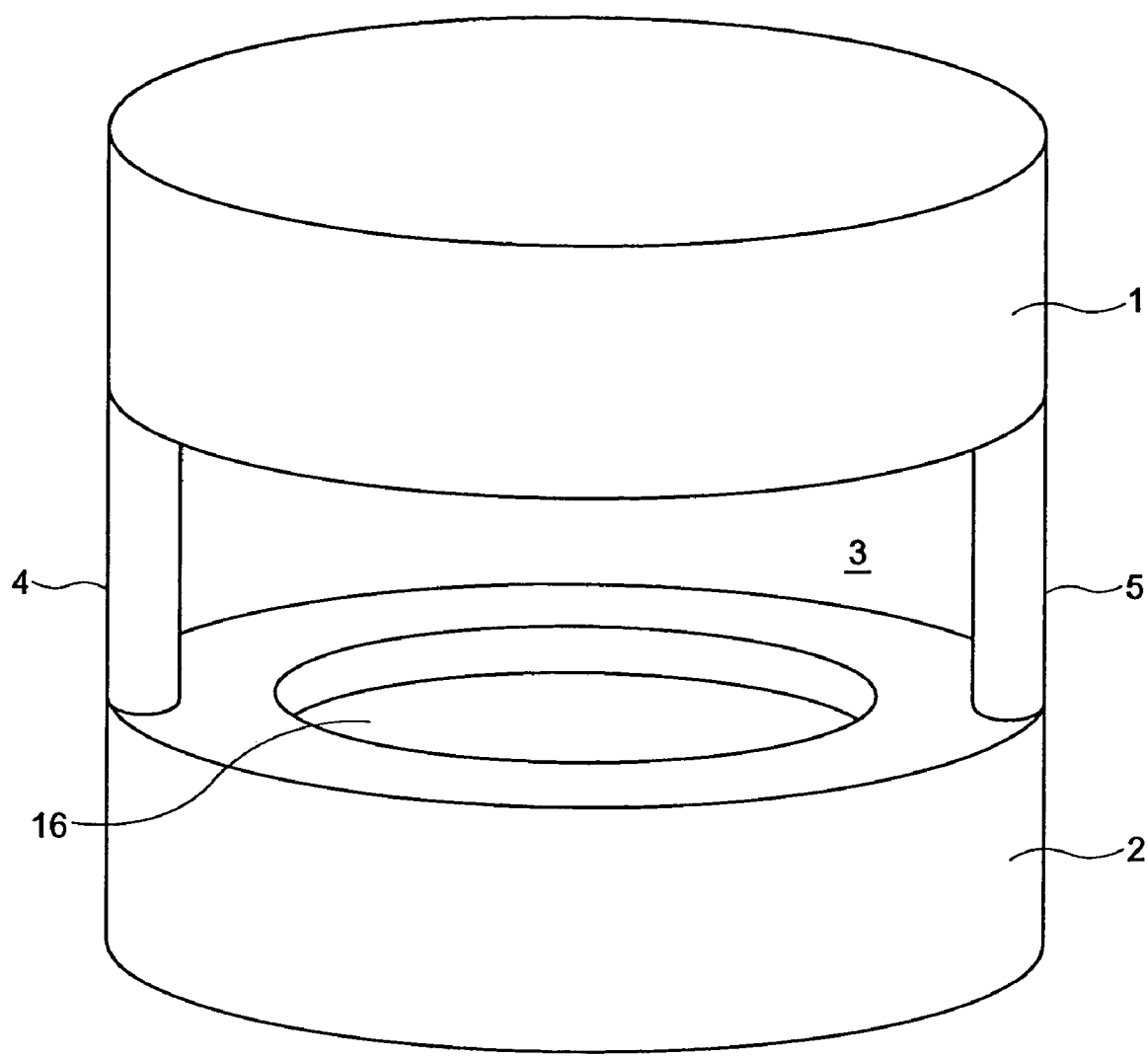
FIG. 1 is an perspective view of a magnet apparatus as an embodiment of the present invention.
Figure 2:
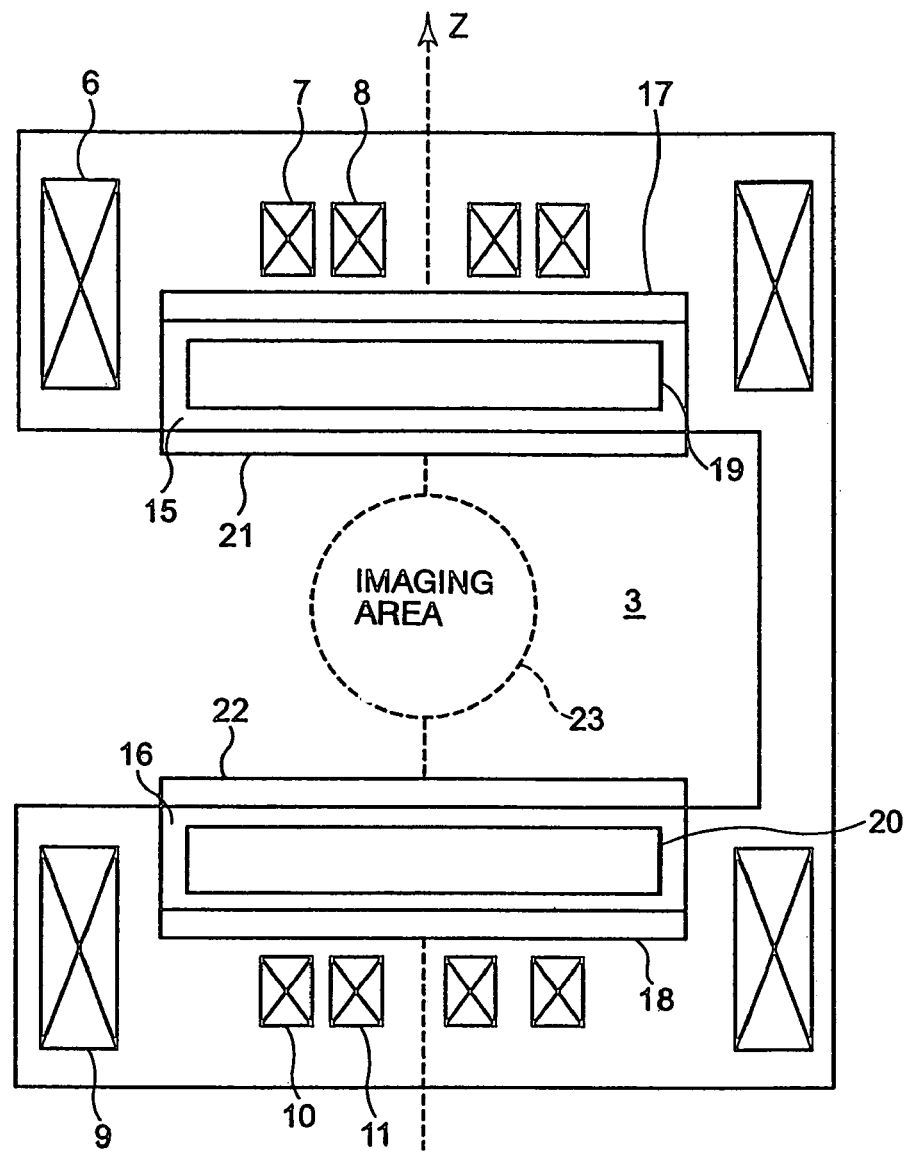
FIG. 2 is a vertical sectional view representing the magnet apparatus shown in FIG. 1.

The following describes an embodiment of the present invention with reference to drawings: FIG. 1 is a perspective view of the magnet apparatus of a magnetic resonance imaging apparatus as the present invention. FIG. 2 is a vertical sectional view representing the magnet apparatus shown in FIG. 1.

As shown in FIG. 1, in the magnet apparatus as a magnetic field generation source for a magnetic resonance imaging apparatus, a pair of coil containers 1 and 2 are arranged face to face with each other through connection columns 4 and 5 to ensure that a pair of coil containers 1 and 2 form a magnetic field space 3. As shown in FIG. 2, the upper coil container 1 accommodates a superconducting coil designed in an annular form, and the lower coil container 2 also accommodates a superconducting coil designed in an annular form.

Figure 3:
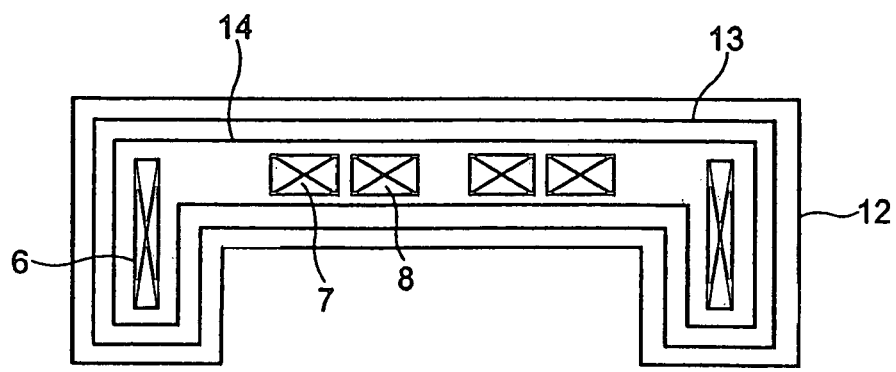
FIG. 3 is a vertical cross sectional view of a coil container.

As shown in FIG. 3, the upper coil container 1 comprises a vacuum container 12 formed in an approximately cylindrical form, and a radiation shield 13 accommodated in the vacuum container 12, and a helium container 14 stored in the radiation shield 13. The helium container 14 incorporates a main coil 6 as an annular superconducting coil, correction coils 7 and 8, and liquid helium as a superconducting refrigerant. FIG. 3 shows the case of the upper coil container 1. The lower coil container 2 is the same as the upper coil container 1.

As shown in FIGS. 1 and 2, the concave portions 15 and 16 of the cylindrical coil containers are formed on the surface, of coil containers 1 and 2, opposing to the magnetic field space 3. Magnetic field homogeneity adjusting apparatuses 17 and 18 are incorporated in the concave portions 15 and 16, and gradient coils 19 and 20 are arranged on the side of the magnetic field homogeneity adjusting apparatuses 17 and 18 where the magnetic field space 3 is located.

RF coils 21 and 22 are arranged on the side of the gradient coils 19 and 20 where the magnetic field space 3 is located. The magnetic field homogeneity adjusting apparatuses 17 and 18, gradient coils 19 and 20, and RF coils 21 and 22 are mounted removably on the coil containers 1 and 2.

The main coil 6, correction coils 7 and 8 accommodated in the upper coil container 1, and the main coil 9 and correction coils 10 and 11 accommodated in the lower coil container 2 operate in such a way as to form a homogeneity magnetic field area in the imaging area 23 as part of the magnetic field space 3. The main coils 6 and 9 are arranged on the outer periphery of the coil containers 1 and 2, where the magnetic field exhibits the highest intensity. A static magnetic field is formed in the perpendicular direction in the magnetic field space. The correction coils 7 and 8 of the upper coil container 1 and the correction coils 10 and 11 of the lower coil container 2 are provided to correct the non-homogeneity components in the magnetic field formed by the main coils 6 and 9, whereby the imaging area 23 is formed into a homogeneity magnetic field.

The direction of the currents of the correction coils 7, 8, 10 and 11 is determined by the non-homogeneity component of the magnetic field occurring in the imaging area 23. For example, the currents of the correction coils 7 and 10 are determined as positive, and those of the correction coils 8 and 11 are determined as negative. Further, gradient coils 19 and 20 are the coils for forming a gradient magnetic field in the imaging area 23, wherein this gradient magnetic field provides information on the position of nuclear magnetic resonance. The RF coils 21 and 22 serve as the transmission coils for applying electromagnetic wave to the imaging area 23.

As described above, the main coils 6 and 9 and correction coils 7, 8, 10 and 11 are arranged to create a homogeneity magnetic field for the imaging 10 area 23. An incorrect magnetic field will be produced in the imaging area due to an assembling error or some factor related to the installation environment. To remove such an incorrect magnetic field, the magnetic field homogeneity adjusting apparatuses 17 and 18 are provided.

Figure 4:
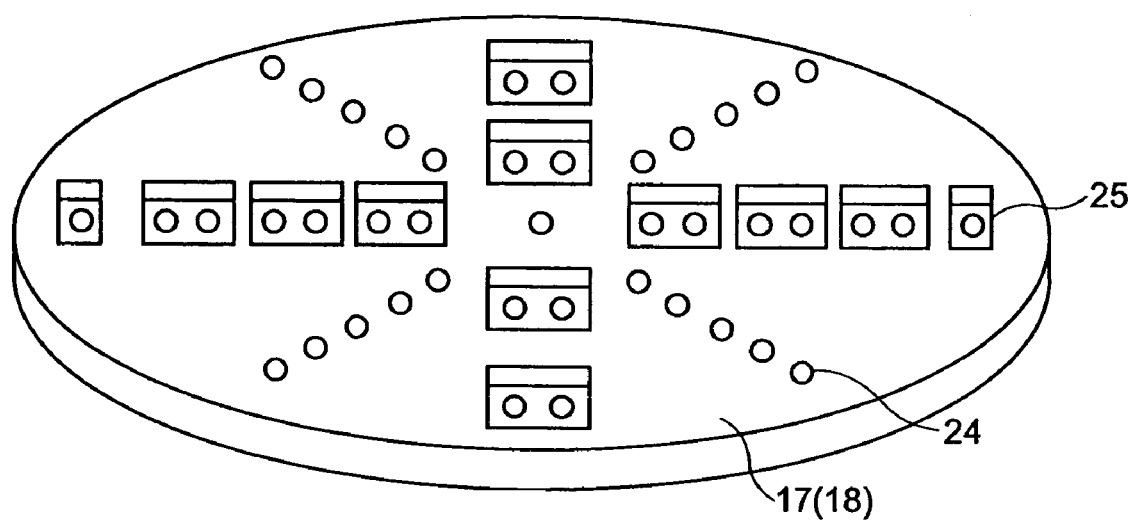
FIG. 4 is a perspective view of a magnetic field homogeneity adjusting apparatus.

As shown in FIG. 4, the magnetic field homogeneity adjusting apparatuses 17 and 18 are disk-formed trays, and are composed of a non-magnetic substance such as FRP and aluminum. As shown in FIG. 5, many tapped holes 24 penetrating from the surface of the magnetic field space 3 (hereinafter referred to as "front surface") to the surface of the coil containers 1 and 2 hereinafter referred to as "back surface") are provided. Rectangular counterbores 25 as mounts are formed on the back surface of the magnetic field homogeneity adjusting apparatuses 17 and 18 so as to incorporate a plurality of tapped holes. To be more specific, the counterbores 25 are arranged in the area covering a plurality of tapped holes. A magnetic field homogeneity adjusting member 26 made of a magnetic substance such as thread-formed iron and permanent magnet is screwed in the tapped holes 24 of the front surface. A plate-formed magnetic field homogeneity adjusting member 27 made of a magnetic substance such as rectangular iron and permanent magnet is arranged in the counterbores 25 of the back surface. The volume of the counterbore 25 is determined to be greater than that of the tapped holes 24 arranged on the front surface of the magnetic field homogeneity adjusting apparatuses 17 and 18. The volume of the plate-formed magnetic field homogeneity adjusting member 27 is determined to be greater than that of the thread-formed magnetic field homogeneity adjusting member 26. Further, the thread-formed magnetic field homogeneity adjusting member 26 is suited for adjusting the magnetic field distribution of low-order error and magnetic field of smaller error. The plate-formed magnetic field homogeneity adjusting member 27 is suited for adjusting the magnetic field distribution of high-order error and magnetic field of greater error.

Figure 6:
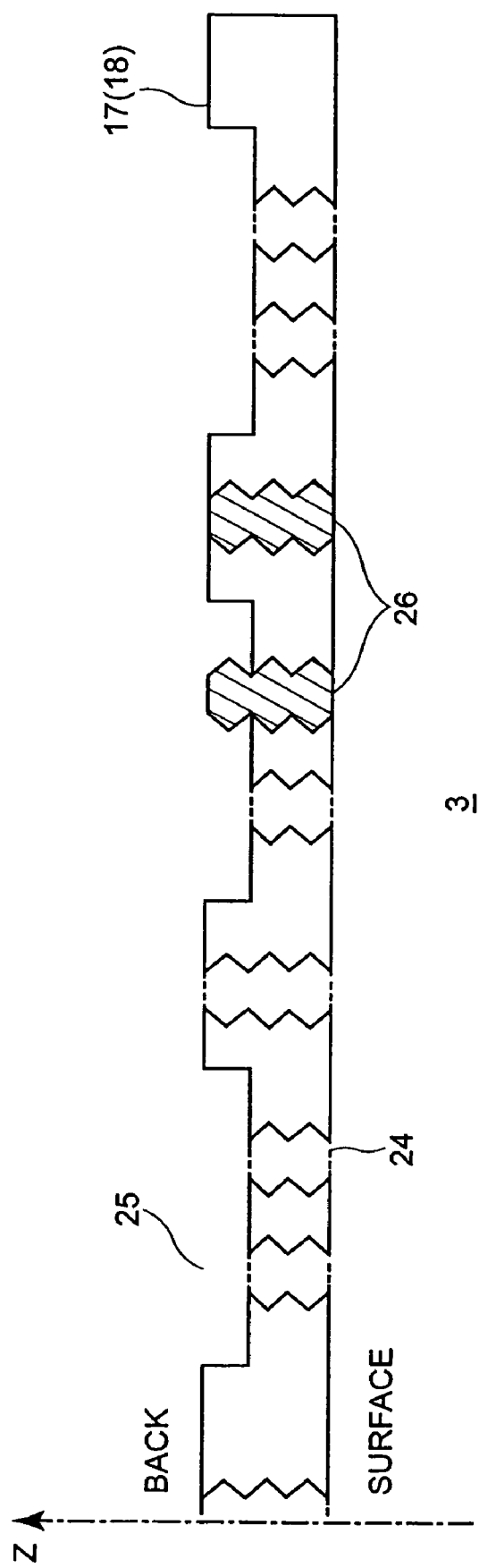
FIG. 6 is a vertical sectional view representing the minor magnetic field adjustment work of the magnetic field homogeneity adjusting apparatus.

When an incorrect magnetic field resulting from an assembling error or installation error—a non-homogeneity magnetic field—is small, homogeneity can be reached by minor magnetic field adjustment. While magnetic field homogeneity adjusting apparatuses 17 and 18 are fixed on the concave portions 15 and 16 of the coil containers 1 and 2, the thread-formed magnetic field homogeneity adjusting member 26 is screwed into the magnetic field homogeneity adjusting apparatuses 17 and 18 from the front surface. In this case, the quantity, volume and position of the thread-formed magnetic field homogeneity adjusting members 26 to be arranged are determined by the direction and magnitude of the incorrect magnetic field component in the imaging area 23. In the minor magnetic field adjustment, the plate-formed magnetic field homogeneity adjusting member 27 is not arranged in the counterbores 25 arranged on the back surfaces of the magnetic field homogeneity adjusting apparatuses 17 and 18. Accordingly, the counterbores 25 remain hollow and the tapped holes 24 are through-holes; therefore, magnetic field can be adjusted using the long thread-formed magnetic field homogeneity adjusting member 26 that reaches the counterbores 25, as shown in FIG. 6.

When an incorrect magnetic field resulting from an assembling error or installation error is great, major magnetic field adjustment is required. The magnetic field homogeneity adjusting apparatuses 17 and 18 are removed from the coil containers 1 and 2, and the plate-formed magnetic field homogeneity adjusting member 27 is placed into the rectangular counterbores 25 on the back surface. In this case, the quantity, volume and position of the magnetic field homogeneity adjusting members 27 to be arranged are determined by the direction and magnitude of the incorrect magnetic field component in the imaging area 23. In the phase of placing the plate-formed magnetic field homogeneity adjusting member 27 in the counterbores 25. It is sufficient only if greater incorrect magnetic field components can be removed. Fine adjustment is not required, and therefore it is not necessary to prepare many types of plate-formed magnetic field homogeneity adjusting members 27.

Figure 7:
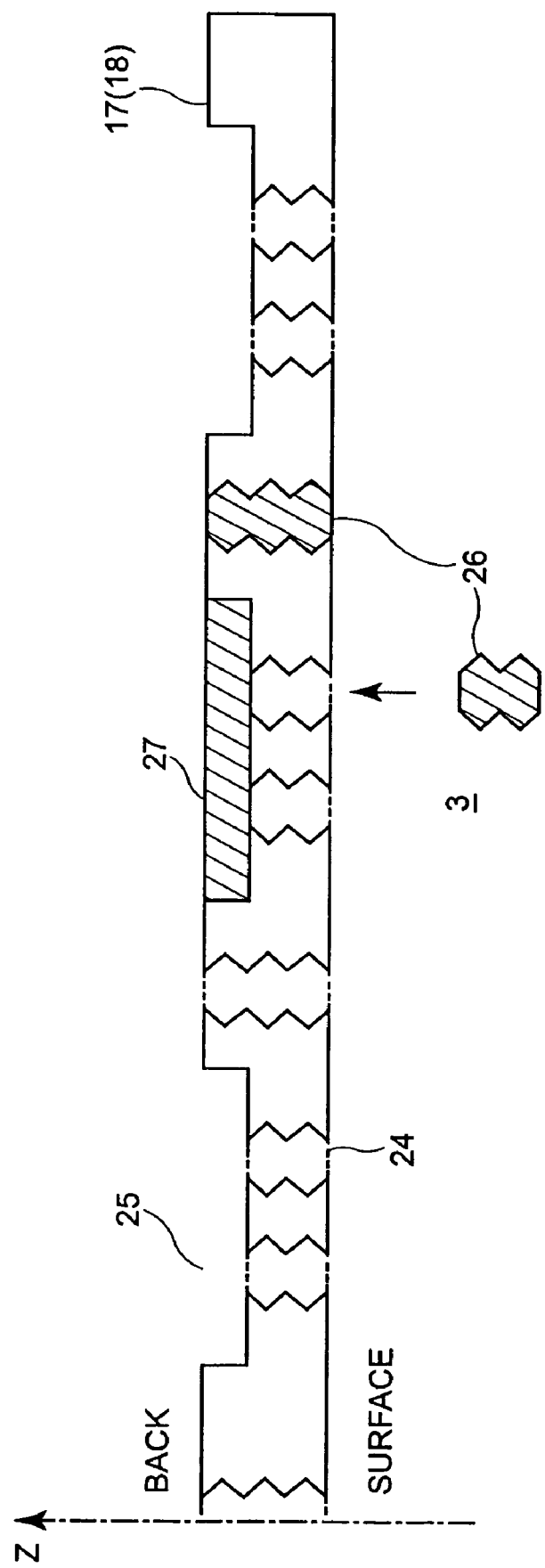
FIG. 7 is a vertical sectional view representing the major magnetic field adjustment work of the magnetic field homogeneity adjusting apparatus.

After the magnetic field homogeneity adjusting apparatuses 17 and 18 with the magnetic field homogeneity adjusting member 27 placed into counterbores 25 have been connected with the coil containers 1 and 2, the thread-formed magnetic field homogeneity adjusting member 26 is screwed into the tapped holes 24 from the front surface. Then minor adjustment of the magnetic field is performed to correct the incorrect magnetic field, whereby a homogeneity magnetic field is obtained. In this case, as shown in FIG. 7, the plate-formed magnetic field homogeneity adjusting members 27 are placed in the counterbores 25 provided on the back surface of the magnetic field homogeneity adjusting apparatuses 17 and 18, so shorter thread-formed magnetic field homogeneity adjusting members 26 are screwed into the tapped holes 24. The magnetic field adjustment range is reduced when shorter magnetic field homogeneity adjusting members are used, as compared to the case where the longer magnetic field homogeneity adjusting members are utilized. Accordingly, finer adjustment of the magnetic field can be performed, when compared to the case where the longer magnetic field homogeneity adjusting members are utilized.

As described above, upon completion of the adjustment of the magnetic field using the magnetic field homogeneity adjusting apparatuses 17 and 18, the gradient coils 19 and 20, and RF coils 21 and 22 are fitted to the coil containers 1 and 2, whereby a magnet apparatus is constructed.

The MRI apparatus comprises a receiving coil for collecting nuclear magnetic resonance signals from a test object when a patient as the test object placed on the bed is brought into the magnetic field space of a magnet apparatus; and an analysis apparatus for analyzing the nuclear magnetic resonance signal having been received.

The present embodiment is so structured that the magnetic field homogeneity adjusting members 26 and 27 to be installed on both the front and back surfaces of the magnetic field homogeneity adjusting apparatuses 17 and 18. This arrangement allows the front surface to be used for major magnetic field homogeneity adjusting work, and the front surface to be used for minor magnetic field homogeneity adjusting work. This arrangement provides a magnet apparatus capable of covering a wide scope of magnetic field homogeneity adjusting work ranging from major adjusting work to minor adjusting work in a limited space.

Large-sized counterbores 25 are formed on the back surfaces of the magnetic field homogeneity adjusting apparatuses 17 and 18. This arrangement ensures minor magnetic field adjusting work to be performed, with the magnetic field homogeneity adjusting apparatuses 17 and 18 installed in position.

The aforementioned arrangement eliminates the need for fine adjustment in the major magnetic field adjusting work, and hence reduces the number of the types of the magnetic field homogeneity adjusting members to be prepared in advance.

FIG. 8 is a drawing representing an example of a variant of magnetic field homogeneity adjusting apparatuses 17 and 18. The magnetic field homogeneity adjusting member 27 is provided with the tapped holes 28 formed at the same position as that of the tapped holes 24 formed on the magnetic field homogeneity adjusting apparatuses 17 and 18. In the minor magnetic field adjustment using the magnetic field homogeneity adjusting member 26, a long magnetic field homogeneity adjusting member 26 can be used even if the magnetic field homogeneity adjusting member 27 is installed. This expands the scope of adjusting the magnetic field in the minor magnetic field adjustment work.

FIG. 9 is a drawing representing an example of another variant of magnetic field homogeneity adjusting apparatuses 17 and 18. The counterbores 25 are formed on the front surface of the magnetic field homogeneity adjusting apparatuses 17 and 18. When the magnetic field homogeneity adjusting apparatuses 17 and 18 are formed in the structure shown in FIG. 9, the magnetic field homogeneity adjusting apparatuses 17 and 18 need not be removed from the coil containers 1 and 2, also in the case of major magnetic field adjustment. This arrangement improves the working efficiency. The tapped holes 28 may be formed on the magnetic field homogeneity adjusting member 27. The magnetic field homogeneity adjusting member 26 can be installed even after the magnetic field homogeneity adjusting member 27 has been installed. This means improved working efficiency.

Figure 10:
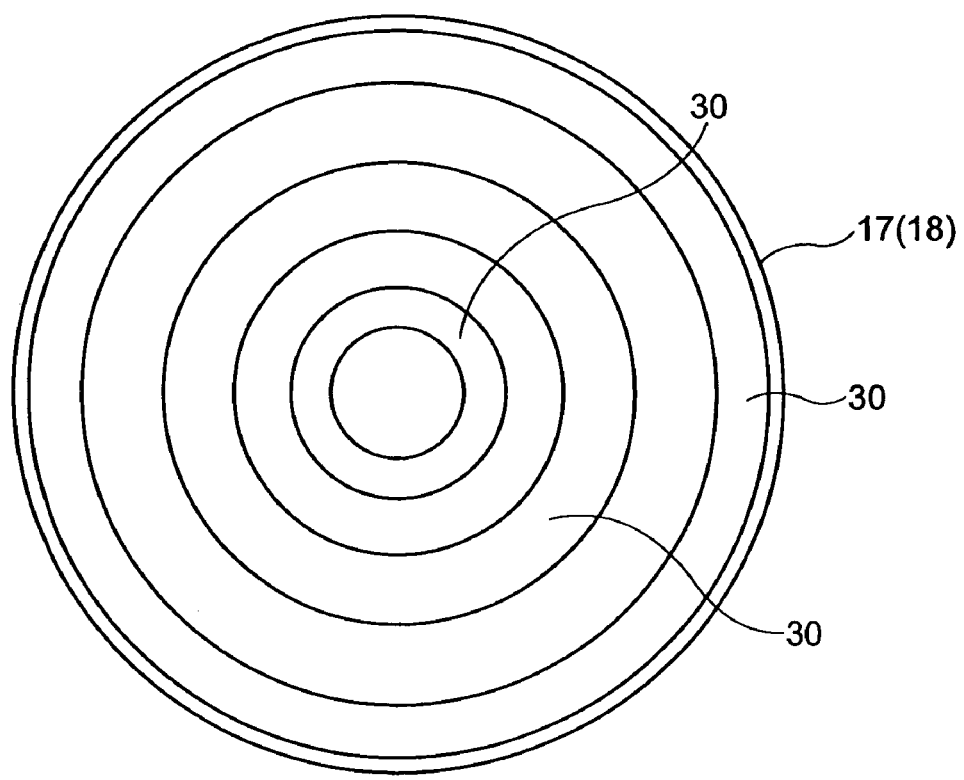
FIG. 10 is a plan view representing an example of a further variation of the magnetic field homogeneity adjusting apparatus.

FIG. 10 is a drawing representing the another embodiment of the magnetic field homogeneity adjusting apparatuses 17 and 18. As illustrated, a plurality of annular grooves 30 are formed in the circumferential direction of the magnetic field homogeneity adjusting apparatuses 17 and 18, and can be used as counterbores 25. In this case, the magnetic field homogeneity adjusting member 27 is fan-shaped, and can be placed at a desired position of the disk-formed magnetic field homogeneity adjusting apparatuses 17 and 18, whereby the degree of freedom in magnetic field homogeneity adjustment is enhanced.

Figure 11:
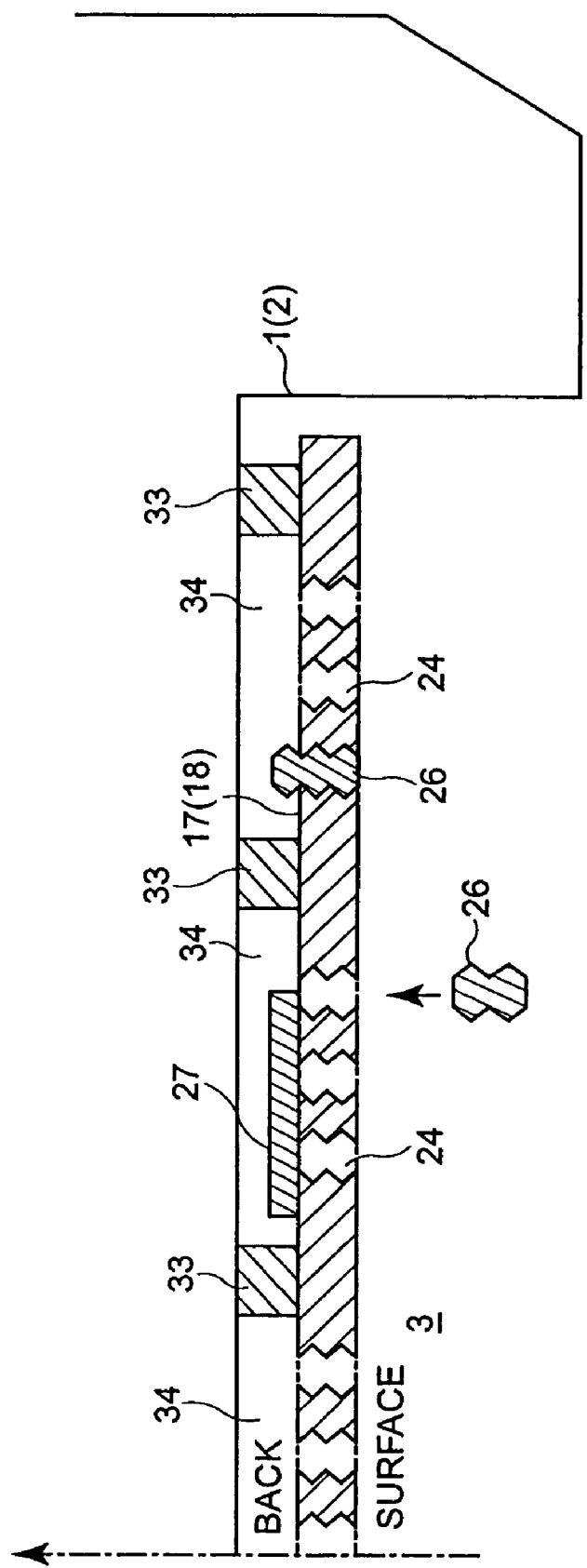
FIG. 11 is a vertical sectional view representing an example of still further variation of the magnetic field homogeneity adjusting apparatus.

Further, FIG. 11 shows still another embodiment of the magnetic field homogeneity adjusting apparatuses 17 and 18. FIG. 11 is a vertical cross sectional view showing an upper coil container 1. The lower coil container is configured in the same way as the upper coil container 1. The plate-formed magnetic field homogeneity adjusting member 17 is supported by a support member 33 secured on the coil container 1. The support members 33 may be arranged like scattered dots at appropriate intervals on the surface of the magnetic field homogeneity adjusting apparatuses 17 and 18 where the upper coil container 1 is located. Alternatively, the supports member 33 may be arranged in a ring-form, as shown in FIG. 10.

A space 34 is formed between the coil container 1 and magnetic field homogeneity adjusting apparatus 17 by the support member 33 provided in the aforementioned manner. The magnetic field homogeneity adjusting members 27 for major magnetic field adjustment can be arranged in this space 34. Further, the magnetic field homogeneity adjusting apparatus 17 is provided with the tapped holes 24, and the magnetic field homogeneity adjusting members 26 can be screwed in the tapped holes 24.

For the aforementioned structure, the magnetic field homogeneity adjusting apparatus 17 is removed from the support member 33, and the magnetic field homogeneity adjusting member 27 is placed at a desired position on the back surface to carried out major magnetic field adjustment, according to the example given in FIG. 11. The magnetic field homogeneity adjusting member 27 can be installed by using screws or adhesives. After the magnetic field homogeneity adjusting member 27 has been installed, the magnetic field homogeneity adjusting apparatus 17 is mounted on the support member 33 and the magnetic field homogeneity adjusting member 26 is installed at a desired position from the front surface of the magnetic field homogeneity adjusting apparatus 17, whereby minor magnetic field adjustment is carried out. The present embodiment allows both major and minor magnetic field adjustment work to be performed using one and the same magnetic field adjusting apparatus, without providing a counterbore.

In the aforementioned embodiments, tapped holes 24 are formed for minor magnetic field adjustment work, whereas the counterbores 25 or space 34 is provided for major magnetic field adjustment work. Without being restricted to such an arrangement, through-holes may be formed minor magnetic field adjustment work. Instead of forming the counterbores 25 or space 34, a steel plate, for example, of the magnetic field homogeneity adjusting member 27 may be attached directly on the front surface or back surface of the magnetic field homogeneity adjusting apparatuses 17 and 18. Further, a magnet apparatus using a superconducting coil as a magnetic field generation source has been described in the aforementioned embodiments. Without being restricted thereto, a non-superconducting coil or a permanent magnet may be used as a magnetic field generation source.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. An apparatus comprising:
   main coils arranged face to face with each other, so as to form a space therebetween for a magnetic field;
   a coil container for each of said main coils; and
   a magnetic field homogeneity adjusting apparatus arranged between said main coils and said magnetic field, to provide homogeneity adjustment of the magnetic field formed in said space;
   wherein
      said magnetic field homogeneity adjusting apparatus has a tray comprised of a non-magnetic substance;
      a face on the magnetic field space side of said tray has at least one opening part for arranging a first magnetic field homogeneity adjusting member comprised of a magnetic substance;
      a face on the coil container side of said tray has a mount for arranging a second magnetic field homogeneity adjusting member comprised of a magnetic substance larger than said first magnetic field homogeneity adjusting member; and
      said opening part is located on said magnetic field space side in the vertical direction with respect to said mount.

2. The apparatus described in claim 1, wherein said first magnetic field homogeneity adjusting member is arranged at said at least one opening part, and said second magnetic field homogeneity adjusting member is arranged at said mount.

3. The apparatus described in claim 1, further comprising a plurality of said at least one opening parts located on said magnetic field space side in the vertical direction with respect to said mount.

4. The apparatus described in claim 1, wherein said second magnetic field homogeneity adjusting member has an opening part for arranging said first magnetic field homogeneity adjusting member.

5. The apparatus described in claim 1, wherein said first magnetic field homogeneity adjusting member is a screw-type member, and said at least one opening part is configured as a threaded hole having a shape corresponding to that of said screw-type member.

6. The magnetic apparatus described in claim 1, wherein a surface of said tray on the coil container side of said coil container has an annular groove in the circumferential direction, and said second magnetic field homogeneity adjusting member is configured as a fan-shaped member which can be placed in said groove.

7. A magnetic resonance imaging apparatus incorporating the apparatus of claim 1.

8. An apparatus comprising:
   main coils arranged face to face with each other, to define a first space therebetween for a magnetic field;
   a coil container for each of said main coils; and
   a magnetic field homogeneity adjusting apparatus arranged between said main coils and said magnetic field to provide homogeneity adjustment of the magnetic field formed in said first space;
   wherein
      said magnetic field homogeneity adjusting apparatus contains a tray comprised of a non-magnetic substance;
      a face on the magnetic field space side of said tray has at least one opening part for arranging a first magnetic field homogeneity adjusting member formed of a magnetic substance;
      a second space is defined between said tray and said coil container for a second magnetic field homogeneity adjusting member formed of a magnetic substance larger than said first magnetic field homogeneity adjusting member, and
      said second space is provided on said magnetic field space side in a vertical direction with respect to said mount.

9. The apparatus described in claim 8, wherein said first magnetic field homogeneity adjusting member is arranged at said at least one opening part, and said second magnetic field homogeneity adjusting member is arranged at said second space.

10. The apparatus described in claim 8, wherein said first magnetic field homogeneity adjusting member is supported on the magnetic field space side of said coil container by a supporting member, and said space is formed by said tray, said coil container and said supporting member.

11. The magnetic apparatus described in claim 8, further comprising a plurality of said at least one opening part, and a plurality of said opening parts are located on said magnetic field space side in the vertical direction with respect to said space.

12. The apparatus described in claim 8, wherein said second magnetic field homogeneity adjusting member has an opening part for arranging said first magnetic field homogeneity adjusting member.

13. The apparatus described in claim 8, wherein said first magnetic field homogeneity adjusting member is configured as a screw-type member, and said at least one opening part is configured as a threaded hole having a shape corresponding to that of said screw-type member.

14. A magnetic resonance imaging apparatus incorporating the apparatus of claim 8.

* * * * *